United States Patent
Nakatani et al.

(10) Patent No.: US 6,967,546 B2
(45) Date of Patent: Nov. 22, 2005

(54) SURFACE ACOUSTIC WAVE FILTER AND FILTER DEVICE

(75) Inventors: Tadashi Nakatani, Kawasaki (JP);
Tsutomu Miyashita, Kawasaki (JP);
Yoshio Satoh, Kawasaki (JP)

(73) Assignees: Fujitsu Media Devices Limited, Yokohama (JP); Fujitsu Limited, Kawasaki (JP)

(*) Notice: Subject to any disclaimer, the term of this patent is extended or adjusted under 35 U.S.C. 154(b) by 76 days.

(21) Appl. No.: 10/685,704

(22) Filed: Oct. 16, 2003

(65) Prior Publication Data

US 2004/0124953 A1 Jul. 1, 2004

(30) Foreign Application Priority Data

Oct. 21, 2002 (JP) .................................... 2002-306041

(51) Int. Cl.$^7$ ................................. H03H 9/64
(52) U.S. Cl. ...................... 333/193; 333/195
(58) Field of Search ................... 333/193–196, 333/133; 310/313 B, 313 D

(56) References Cited

U.S. PATENT DOCUMENTS

| | | | | |
|---|---|---|---|---|
| 5,631,612 A | * | 5/1997 | Satoh et al. | 333/193 |
| 5,719,536 A | * | 2/1998 | Matsui et al. | 333/193 |
| 5,874,866 A | * | 2/1999 | Satoh et al. | 331/107 A |
| 6,246,148 B1 | * | 6/2001 | Flowers et al. | 310/313 B |
| 6,747,530 B1 | * | 6/2004 | Selmeier | 333/193 |

FOREIGN PATENT DOCUMENTS

| | | | |
|---|---|---|---|
| JP | 6-69750 | 3/1994 | ................. 333/193 |
| JP | 10-13183 | 1/1998 | |
| JP | 11-205080 | 7/1999 | |

OTHER PUBLICATIONS

Satoh, Yoshio, et al., "RF Band SAW Filters for Cellular Phones," IEICE Transactions, vol. 84, No. 11, Nov. 2001, pp. 782–789.

Nakatani, Tadashi, et al., Development of Ladder–Type SAW Filter for 5 GHz Band, Proceedings of the 2001 IEICE ESS Conference, SA–3–9, Sep. 2001, p. 289.

Satoh, Yoshio, et al., "Low–Loss Band Filter Using SAW Resonators," IEICE Transactions, A, vol. J76–A, No. 2, Feb. 1993, pp. 245–252.

* cited by examiner

Primary Examiner—Barbara Summons
(74) Attorney, Agent, or Firm—Arent Fox PLLC

(57) ABSTRACT

A surface acoustic wave filter includes series-arm resonators and parallel-arm resonators that are connected in a ladder-like fashion. This surface acoustic wave filter satisfies conditions expressed as:

$$1 \times 10^6 \leq 4\pi^2 f_0^2 R^2 CopCos \leq 3.1 \times 10^6$$

where Cop is the electrostatic capacitance of the parallel-arm resonators, Cos is the electrostatic capacitance of the series-arm resonators, $f_0$ is the center frequency, and R is the nominal impedance.

15 Claims, 17 Drawing Sheets

COMPARATIVE EXAMPLE

SURFACE ACOUSTIC WAVE FILTER AND FILTER DEVICE

BACKGROUND OF THE INVENTION

1. Field of the Invention

The present invention generally relates to a surface acoustic wave filter and a filter device.

2. Description of the Related Art

In the mobile telephone devices and wireless LAN (Local Area Network) systems today, frequency bands, such as the 800 MHz band, the 1.9 GHz band, and the 2.4 GHz band, are used. However, as the amount of information to be transmitted and the demand for higher communication speed has increased, frequency bands used in communications are shifting to higher frequency bands such as the 5 GHz band. In this trend, there is an increasing demand for bandpass filters that operate in frequency bands of 5 GHz and higher.

Meanwhile, surface acoustic wave (SAW) filters have become indispensable as RF band filters and IF band filters for mobile communication devices such as portable telephones, because of their steep cut-off characteristics, smallness, lightness, and inexpensiveness.

A SAW filter is produced by processing a thin film, such as an aluminum film, to form comb-like electrodes on a piezoelectric substrate made of lithium tantalate crystal or the like. After a chip is cut out of the processed substrate, the chip is mounted on a ceramic package of several millimeters in size, and is then electrically connected to the ceramic package by a bonding wire or the like.

Ladder-type SAW filters having SAW resonators with comb-like electrodes connected in a ladder-like fashion are generally known as a means to obtain steep pass characteristics required in filters for portable telephone devices that exhibit low losses in a broad band. In terms of losses, ladder-type SAW filters are considered more suitable for the use in higher frequency bands than filters of other types. An example of such a ladder-type SAW filter is disclosed in "RF Band SAW Filters for Cellular Phones (Yoshio Satoh and Osamu Ikata, IEICE Transactions, Vol. 84, No. 11, November 2001, pp. 782–789)".

In a ladder-type SAW filter, the electrostatic capacitance is adjusted by changing the aperture length and the number of electrode finger pairs in each of parallel-arm and series-arm SAW resonators connected in a ladder-like fashion, so that the input/output impedance can be matched with that of an external circuit. Japanese Unexamined Patent Publication No. 6-69750, for example, discloses a method of adjusting the electrostatic capacitances of SAW resonators to achieve excellent impedance matching. As the resonant frequency of the parallel-arm resonators and the antiresonant frequency of the series-arm resonators are substantially the same in the neighborhood of the center frequency under the condition of a constant K type filter, logical matching conditions can be expressed as:

$$1/(\omega_0^2 CopCos) = R^2, \omega_0 = 2\pi f_0 \qquad (1)$$

where $f_0$ is the center frequency, Cop is the electrostatic capacitance of the parallel-arm resonators, Cos is the electrostatic capacitance of the series-arm resonators, and R is the nominal impedance. In bandpass filters for the RF units for wireless mobile communications, the nominal impedance R is normally 50 Ω.

Further, the optimum matching conditions that can be determined from the actual input/output impedance of a ladder-type SAW filter can be expressed as:

$$-0.28Cos + 3448/f_0 - 746/f_0 \leq Cop \leq -0.28Cos + 3448/f_0 + 746/f_0 \qquad (2)$$

Here, the center of the electrostatic capacitance Cop of the parallel-arm resonators can be expressed as:

$$Cop = -0.28Cos + 3448/f_0 \qquad (3)$$

FIG. 1 shows the range of the electrostatic capacitances Cop and Cos that satisfy the matching conditions represented by the expression (2), with the center frequency $f_0$ of the filter characteristics being 5.25 GHz. FIG. 2 shows the filter characteristics of a ladder-type SAW filter that was produced by setting the aperture length and the number of electrode finger pairs in each of the parallel-arm and series-arm SAW resonators in such a manner that the electrostatic capacitances Cop and Cos fall in the range indicated by the slanting lines in FIG. 1. In this example, aluminum (Al) with 1% copper (Cu) was used for the electrode film. FIG. 3 shows an equivalent circuit of this ladder-type SAW filter. In FIG. 3, each S represents a series-arm SAW resonator, and each P represents a parallel-arm SAW resonator.

As is apparent from FIG. 2, the center frequency in the filter characteristics of this ladder-type SAW filter was 5.2 GHz, the 4 dB bandwidth was 230 MHz, and the smallest insertion loss was 2 dB. Such a ladder-type SAW filter is disclosed in detail in "Development of Ladder-Type SAW Filter for 5 GHz Band (Tadashi Nakatani, Tokihiro Nishihara, Tsutomu Miyashita, and Yoshio Satoh, Proceedings of the 2001 IEICE ESS Conference, SA-3-9, September 2001, p. 289).

FIG. 4 shows the range of the electrostatic capacitances Cop and Cos that satisfy the matching conditions represented by the expression (2), with the center frequency $f_0$ in the filter characteristics being 1.9 GHz. This ladder-type SAW filter has the same equivalent circuit as that of FIG. 3.

As is apparent from the above facts, the electrostatic capacitances of SAW resonators need to be made smaller, as the center frequency $f_0$ of the filter becomes higher. When the ratio Cop/Cos of the electrostatic capacitance Cop to the electrostatic capacitance Cos, which is one of the essential design parameters, is set at a standard value of 0.5 in a 1.9-GHz-band filter, the electrostatic capacitance Cop is in the range of approximately 1 pF to 1.5 pF, while the electrostatic capacitance Cos is in the range of approximately 2 pF to 3 pF, as shown in FIG. 4. In a 5-GHz-band SAW filter, on the other hand, the electrostatic capacitance Cop is in the range of approximately 0.3 pF to 0.5 pF, while the electrostatic capacitance Cos is in the range of approximately 0.6 pF to 1 pF, as shown in FIG. 1.

With smaller capacitances, however, the stray capacitance (approximately 0.4 pF) that exists between a signal terminal and a ground terminal in a ceramic package to which the SAW filter chip is mounted, and the stray capacitance (approximately 0.1 pF) that exists between signal electrodes and ground electrodes in the SAW filter chip, have a greater influence on the impedance matching. As a result, the impedance matching becomes poorer and causes a problem of a greater insertion loss of the SAW filter.

Japanese Unexamined Patent Publication No. 11-205080 discloses a method of reducing stray capacitance. In accordance with this disclosure, the stray capacitance existing between a metallized region in a package and an electrode film formed on the metallized region is reduced by minimizing the metallized region. Japanese Unexamined Patent Publication No. 10-13183 discloses another method of reducing stray capacitance. In accordance with this disclosure, signal electrodes are located at a distance of 10 μm or longer from ground electrodes on a piezoelectric substrate, so that stray capacitance is reduced.

However, the quantity of stray capacitance that can be eliminated by any of the above methods is too small to solve the aforementioned problems. By the method disclosed in Japanese Unexamined Patent Publication No. 10-13183, the filter chip becomes larger with an increase in the distance between electrodes, and the wiring length increases accordingly, resulting in a greater loss due to a greater wiring resistance.

SUMMARY OF THE INVENTION

It is therefore an object of the present invention to provide a surface acoustic wave filter and a filter device in which the above disadvantage is eliminated.

A more specific object of the present invention is to provide a surface acoustic wave filter and a filter device in which stray capacitance is reduced while an increase in chip size is avoided.

The above objects of the present invention are achieved by a surface acoustic wave filter comprising series-arm resonators and parallel-arm resonators that are connected in a ladder-like fashion, the surface acoustic wave filter satisfying conditions expressed as:

$$1 \times 10^6 \leq 4\pi^2 f_0^2 R^2 CopCos \leq 3.1 \times 10^6$$

where Cop is an electrostatic capacitance of the parallel-arm resonators, Cos is an electrostatic capacitance of the series-arm resonators, $f_0$ is a center frequency, and R is a nominal impedance.

The above objects of the present invention are also achieved by a surface acoustic wave filter comprising series-arm resonators and parallel-arm resonators that are connected in a ladder-like fashion, the surface acoustic wave filter satisfying conditions expressed as:

$$1.3 \times 10^6 \leq 4\pi^2 f_0^2 R^2 CopCos \leq 3.1 \times 10^6$$

where Cop is an electrostatic capacitance of the parallel-arm resonators, Cos is an electrostatic capacitance of the series-arm resonators, $f_0$ is a center frequency, and R is a nominal impedance.

The above objects of the present invention are achieved by a surface acoustic wave filter comprising series-arm resonators and parallel-arm resonators that are connected in a ladder-like fashion, the surface acoustic wave filter satisfying conditions expressed as:

$$1.6 \times 10^6 \leq 4\pi^2 f_0^2 R^2 CopCos \leq 2.9 \times 10^6$$

where Cop is an electrostatic capacitance of the parallel-arm resonators, Cos is an electrostatic capacitance of the series-arm resonators, $f_0$ is a center frequency, and R is a nominal impedance.

The above objects of the present invention are achieved by a filter device comprising: a surface acoustic wave filter: and a package to which the surface acoustic wave filter is mounted by a wire bonding technique, the surface acoustic wave filter including series-arm resonators and parallel-arm resonators that are connected in a ladder-like fashion, the surface acoustic wave filter satisfying conditions expressed as:

$$1 \times 10^6 \leq 4\pi^2 f_0^2 R^2 CopCos \leq 3.1 \times 10^6$$

where Cop is an electrostatic capacitance of the parallel-arm resonators, Cos is an electrostatic capacitance of the series-arm resonators, $f_0$ is a center frequency, and R is a nominal impedance, the package having a signal terminal connected to signal electrodes of the surface acoustic wave filter with one bonding wire, and the bonding wire having an inductance Li that satisfies conditions expressed as:

$$0.7 \leq Li \leq 1.3.$$

The above objects of the present invention are achieved by a filter device comprising: a surface acoustic wave filter: and a package to which the surface acoustic wave filter is mounted by a wire bonding technique, the surface acoustic wave filter including series-arm resonators and parallel-arm resonators that are connected in a ladder-like fashion, the surface acoustic wave filter satisfying conditions expressed as:

$$1.3 \times 10^6 \leq 4\pi^2 f_0^2 R^2 CopCos \leq 3.1 \times 10^6$$

where Cop is an electrostatic capacitance of the parallel-arm resonators, Cos is an electrostatic capacitance of the series-arm resonators, $f_0$ is a center frequency, and R is a nominal impedance, the package having a signal terminal connected to signal electrodes of the surface acoustic wave filter with one bonding wire, and the bonding wire having an inductance Li that satisfies conditions expressed as:

$$0.7 \leq Li \leq 1.3.$$

The above objects of the present invention are also achieved by a filter device comprising: a surface acoustic wave filter: and a package to which the surface acoustic wave filter is mounted by a wire bonding technique, the surface acoustic wave filter including series-arm resonators and parallel-arm resonators that are connected in a ladder-like fashion, the surface acoustic wave filter satisfying conditions expressed as:

$$1.6 \times 10^6 \leq 4\pi^2 f_0^2 R^2 CopCos \leq 2.9 \times 10^6$$

where Cop is an electrostatic capacitance of the parallel-arm resonators, Cos is an electrostatic capacitance of the series-arm resonators, $f_0$ is a center frequency, and R is a nominal impedance, the package having a signal terminal connected to signal electrodes of the surface acoustic wave filter with one bonding wire, and the bonding wire having an inductance Li that satisfies conditions expressed as:

$$0.7 \leq Li \leq 1.3.$$

The above objects of the present invention are achieved by a filter device comprising: a surface acoustic wave filter: and a package to which the surface acoustic wave filter is flip-chip mounted, the surface acoustic wave filter including series-arm resonators and parallel-arm resonators that are connected in a ladder-like fashion, the surface acoustic wave filter satisfying conditions expressed as:

$$1 \times 10^6 \leq 4\pi^2 f_0^2 R^2 CopCos \leq 3.1 \times 10^6$$

where Cop is an electrostatic capacitance of the parallel-arm resonators, Cos is an electrostatic capacitance of the series-arm resonators, $f_0$ is a center frequency, and R is a nominal impedance, the package having a signal line formed by a microstrip line, and the microstrip line having an inductance Li that satisfies conditions expressed as:

$$0.7 \leq Li \leq 1.3.$$

The above objects of the present invention are also achieved by a filter device comprising: a surface acoustic wave filter: and a package to which the surface acoustic wave filter is flip-chip mounted, the surface acoustic wave filter including series-arm resonators and parallel-arm resonators that are connected in a ladder-like fashion, the surface acoustic wave filter satisfying conditions expressed as:

$$1.3 \times 10^6 \leq 4\pi^2 f_0^2 R^2 CopCos \leq 3.1 \times 10^6$$

where Cop is an electrostatic capacitance of the parallel-arm resonators, Cos is an electrostatic capacitance of the series-arm resonators, $f_0$ is a center frequency, and R is a nominal impedance, the package having a signal line formed by a microstrip line, and the microstrip line having an inductance Li that satisfies conditions expressed as:

$$0.7 \leq Li \leq 1.3.$$

The above objects of the present invention are achieved by a 1 filter device comprising: a surface acoustic wave filter: and a package to which the surface acoustic wave filter is flip-chip mounted, the surface acoustic wave filter including series-arm resonators and parallel-arm resonators that are connected in a ladder-like fashion, the surface acoustic wave filter satisfying conditions expressed as:

$$1.6 \times 10^6 \leq 4\pi^2 f_0^2 R^2 CopCos \leq 2.9 \times 10^6$$

where Cop is an electrostatic capacitance of the parallel-arm resonators, Cos is an electrostatic capacitance of the series-arm resonators, $f_0$ is a center frequency, and R is a nominal impedance, the package having a signal line formed by a microstrip line, and the microstrip line having an inductance Li that satisfies the conditions expressed as:

$$0.7 \leq Li \leq 1.3.$$

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS (First Embodiment)

The following is a detailed description of a first embodiment of the present invention, with reference to the accompanying drawings. In this embodiment, the product CopCos of the electrostatic capacitance Cop of parallel-arm SAW resonators (hereinafter referred to simply as the parallel-arm resonators) and the electrostatic capacitance Cos of series-arm SAW resonators (hereinafter referred to simply as the series-arm resonators) is set so that the adverse influence of stray capacitance can be reduced.

Figure 1:
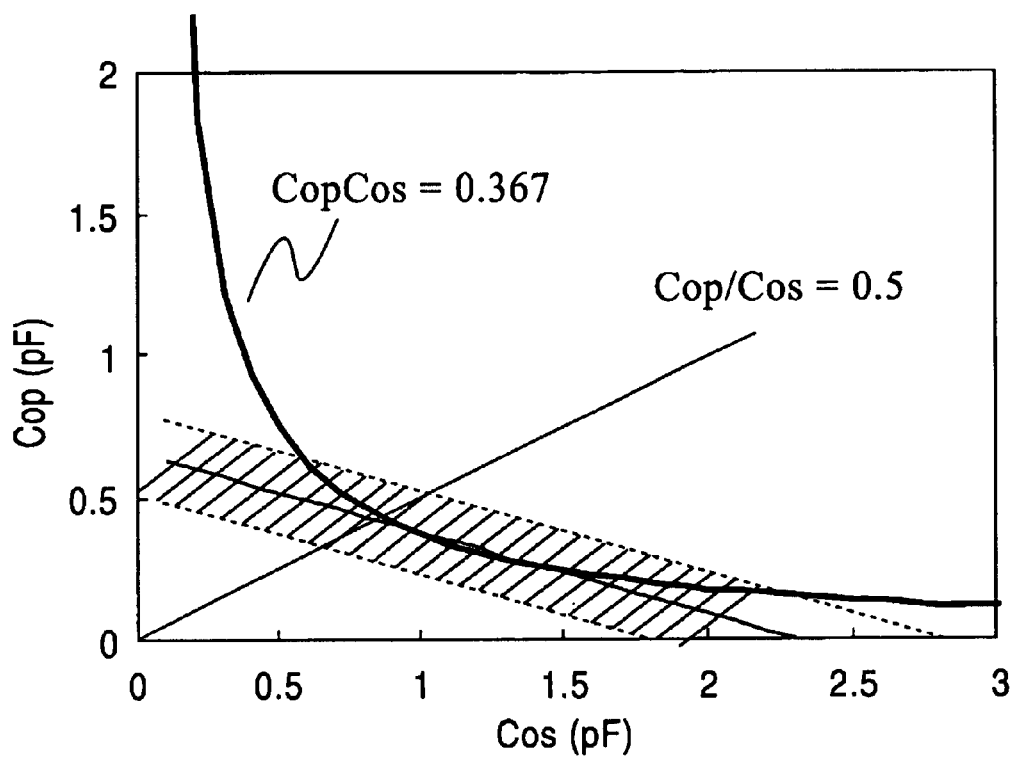
FIG. 1 is a graph showing the range of capacitances Cop and Cos that satisfy the matching condition represented by the expression (2), with the center frequency in the filter characteristics of the prior art being 5.25 GHz.
Figure 2:
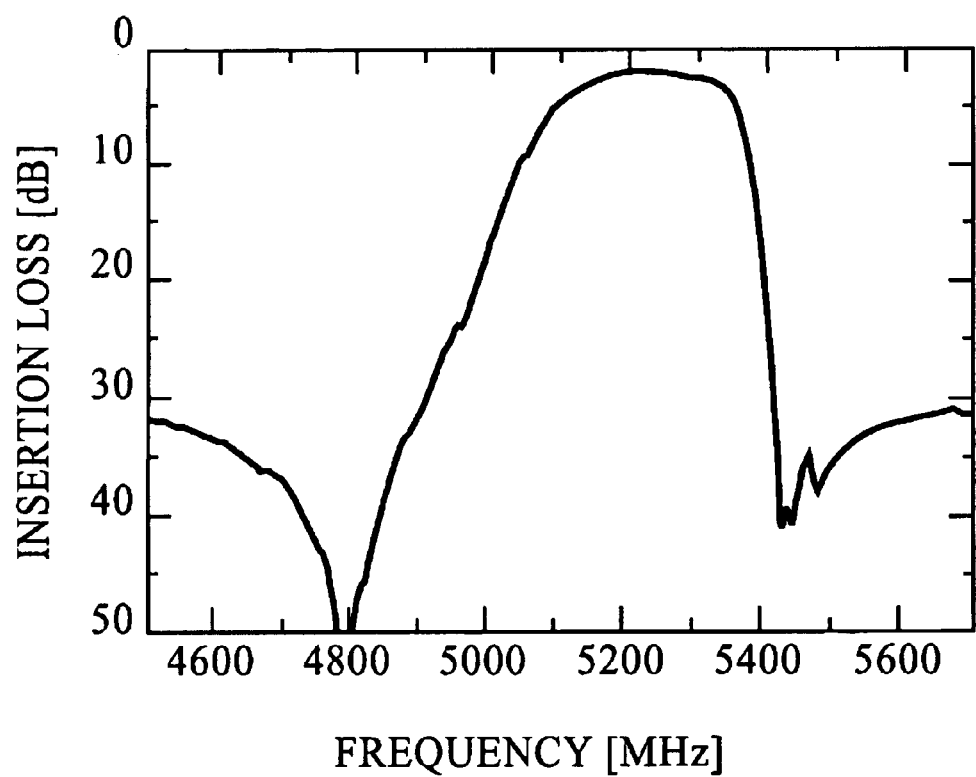
FIG. 2 is a graph showing the filter characteristics of a conventional ladder-type SAW filter that is designed by determining the aperture length and the number of electrode finger pairs of each of the parallel-arm SAW resonators and the series-arm SAW resonators so that the electrostatic capacitances Cop and Cos fall in the range indicated by the slanting lines of FIG. 1.
Figure 3:
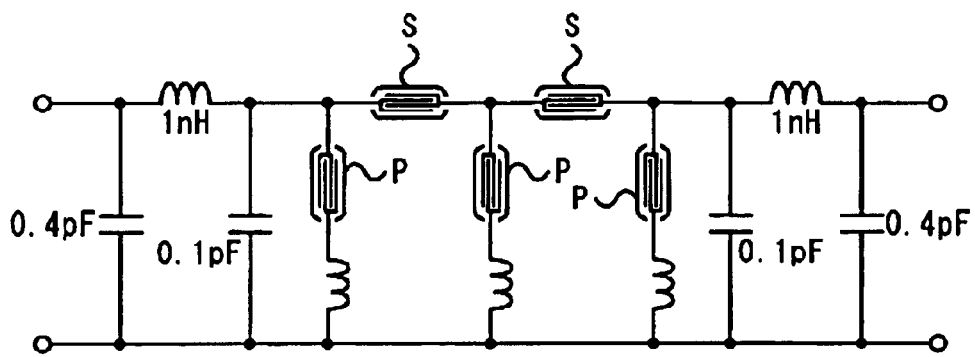
FIG. 3 shows an equivalent circuit of the conventional ladder-type SAW filter that exhibits the filter characteristics shown in FIG. 2.
Figure 4:
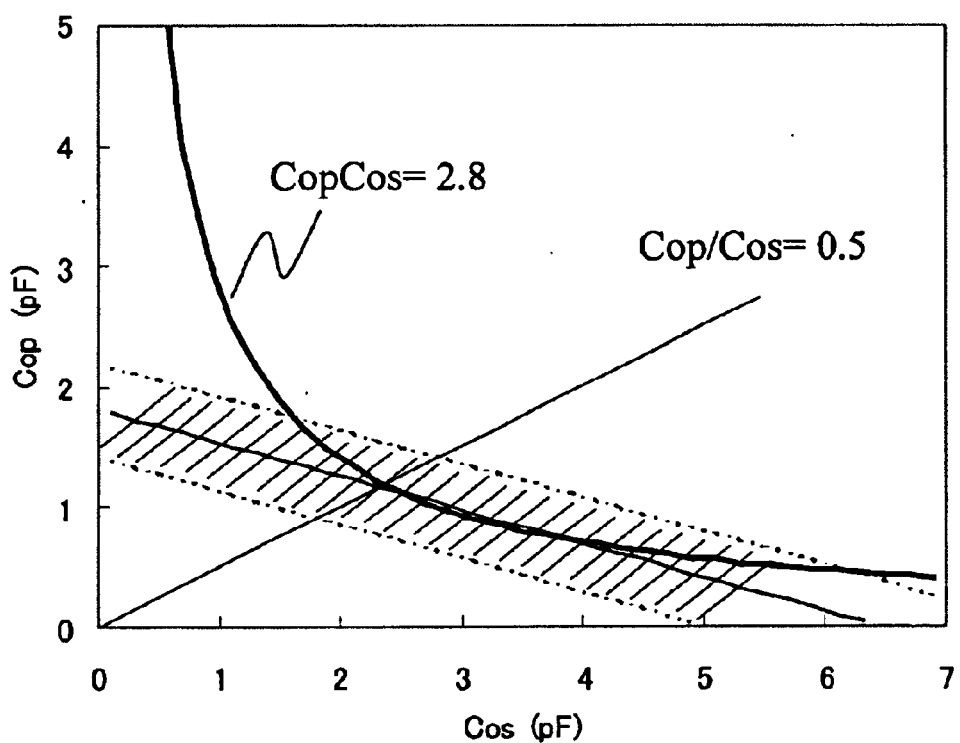
FIG. 4 is a graph showing the range of the electrostatic capacitances Cop and Cos that satisfy the matching conditions represented by the expression (2), with the center frequency in the filter characteristics of the prior art being 1.9 GHz.
Figure 5:
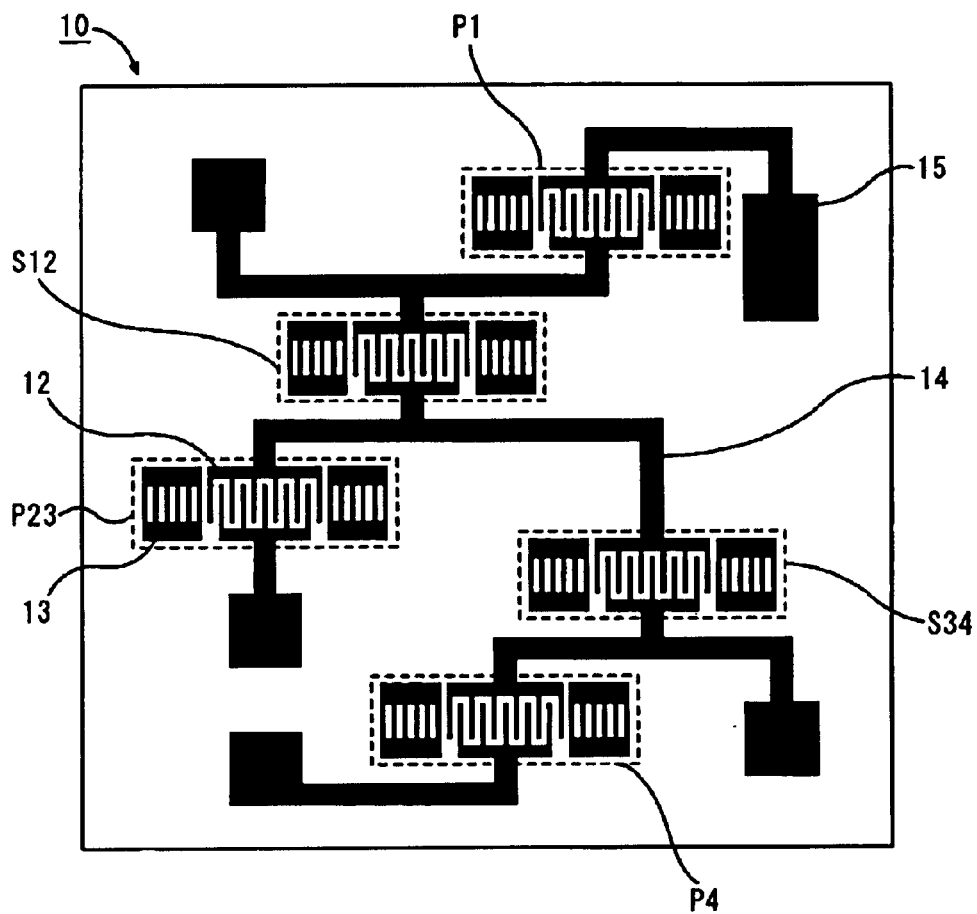
FIG. 5 is a top view of a ladder-type SAW filter in accordance with a first embodiment of the present invention.
Figure 6:
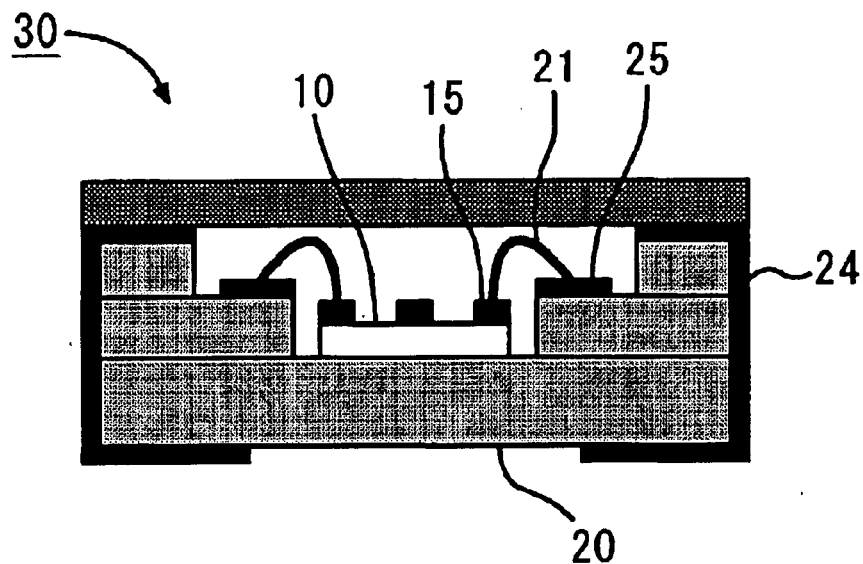
FIG. 6 is a section view of a filter device having the ladder-type SAW filter of FIG. 5 mounted on a package, taken along the line of the SAW propagation direction.

FIG. 5 is a top view of a ladder-type SAW filter 10 in accordance with this embodiment. The ladder-type SAW filter 10 has a four-stage ladder structure. FIG. 6 is a section view of the ladder-type SAW filter 10 mounted on a package 20, taken along the line of the SAW propagation direction in the structure shown in FIG. 5.

As shown in FIG. 5, the ladder-type SAW filter 10 has series-arm resonators S (S12 and S34) and parallel-arm resonators P (P1, P23, and P4) connected in a ladder-like fashion. Each of the series-arm resonators S12 and S34 has two series-arm resonators S combined into one. The parallel-arm resonator P23 also has two parallel-arm resonators P combined into one.

In this structure, each of the series-arm resonators S and the parallel-arm resonators P has a resonator region that includes comb-like electrodes (interdigital transducers: IDTs) 12 formed on a substrate 11, and reflector regions that sandwich the resonator region in the SAW propagation direction and include reflection electrodes 13 formed on the substrate 11. Each IDT 12 is connected to an electrode pad unit 15 via a wiring unit 14, so as to be connected to an electrode pad unit 25 of the package 20 via the electrode pad unit 15, as shown in FIG. 6. Here, it is preferable to use a conductive layer to form the IDTs 12, the reflection electrodes 13, the wiring unit 14, and the electrode pad unit 15.

Figure 7:
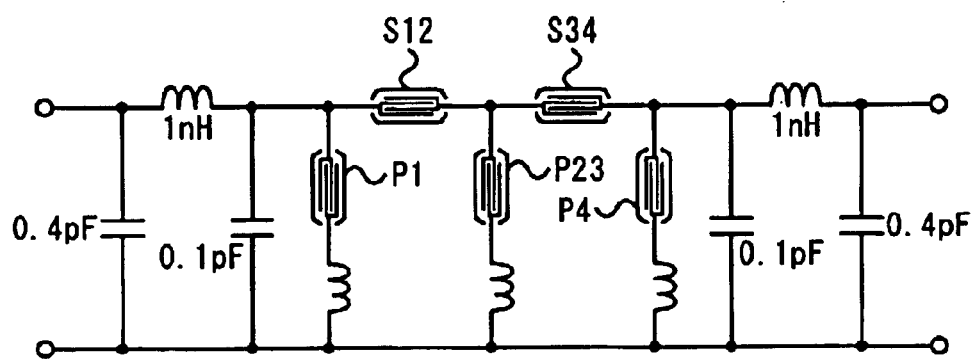
FIG. 7 shows an equivalent circuit of the filter device of FIG. 6.

As can be seen from FIG. 6, the ladder-type SAW filter 10 is housed in the package 20 in a face-up state. Here, the electrode pad unit 15 of the ladder-type SAW filter 10 is connected to the electrode pad unit 25 of the package 20 with a bonding wire 21 (or a ribbon) made of gold (Au), copper (Cu), aluminum (Al), or the like. Thus, a filter device 30 is formed. An equivalent circuit of the filter device 30 is shown in FIG. 7. The capacitances Cop and Cos of the parallel-arm resonators P and the series-arm resonators S are determined by the electrode finger interval, the aperture length, and the number of electrode finger pairs in each IDT 12.

Figure 8A:
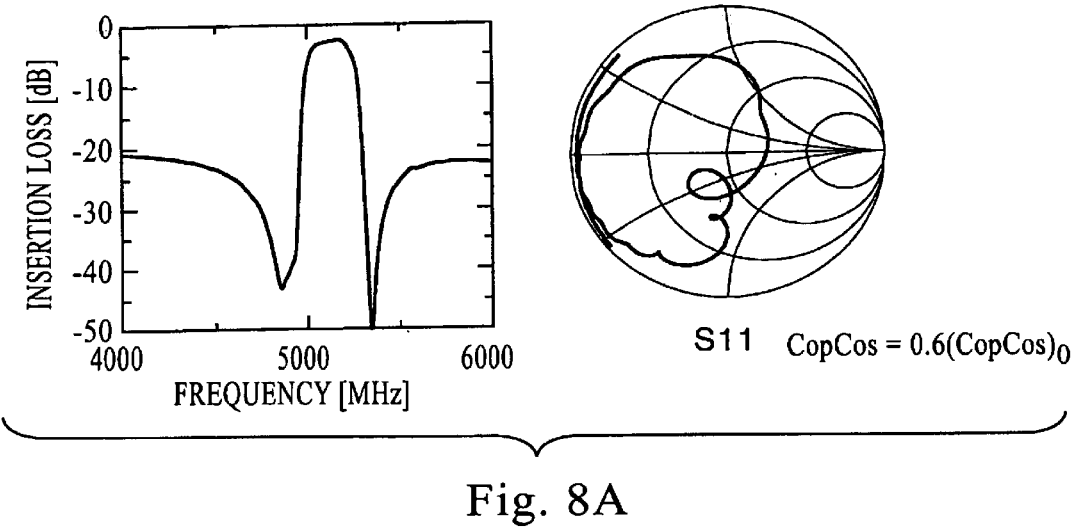
FIGS. 8A through 8D are graphs showing results of simulations carried out on samples of the filter device of FIG. 6.
Figure 8B:
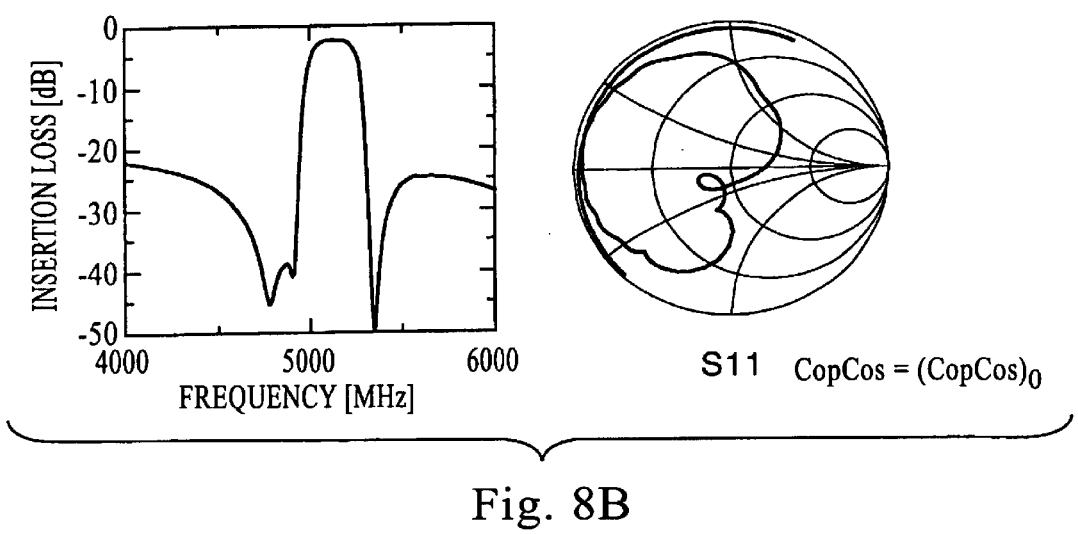
Figure 8C:
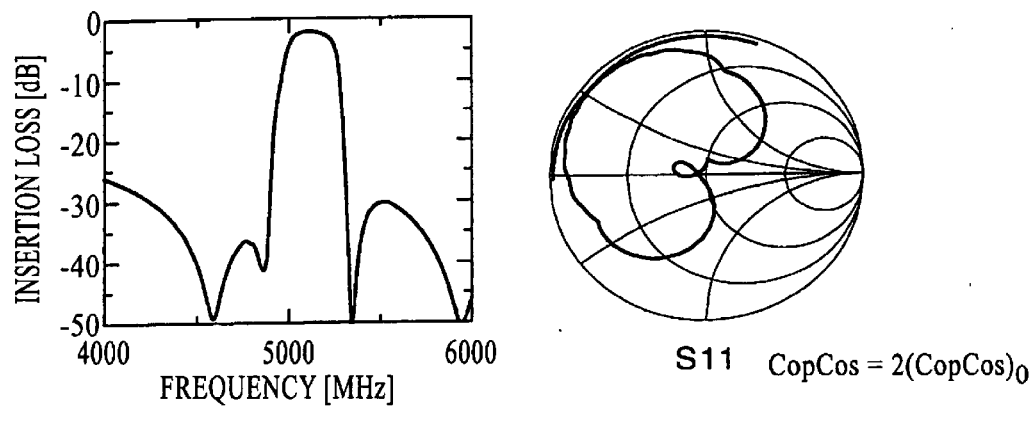
Figure 8D:
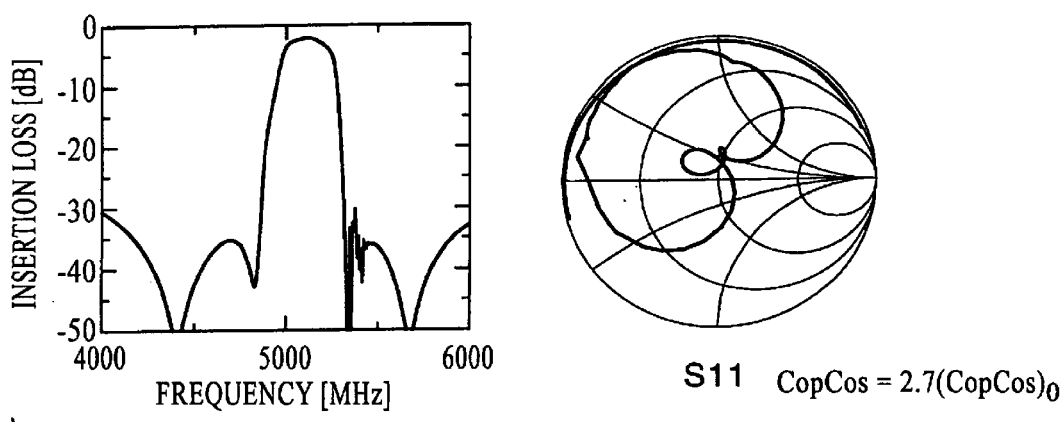
Figure 9:
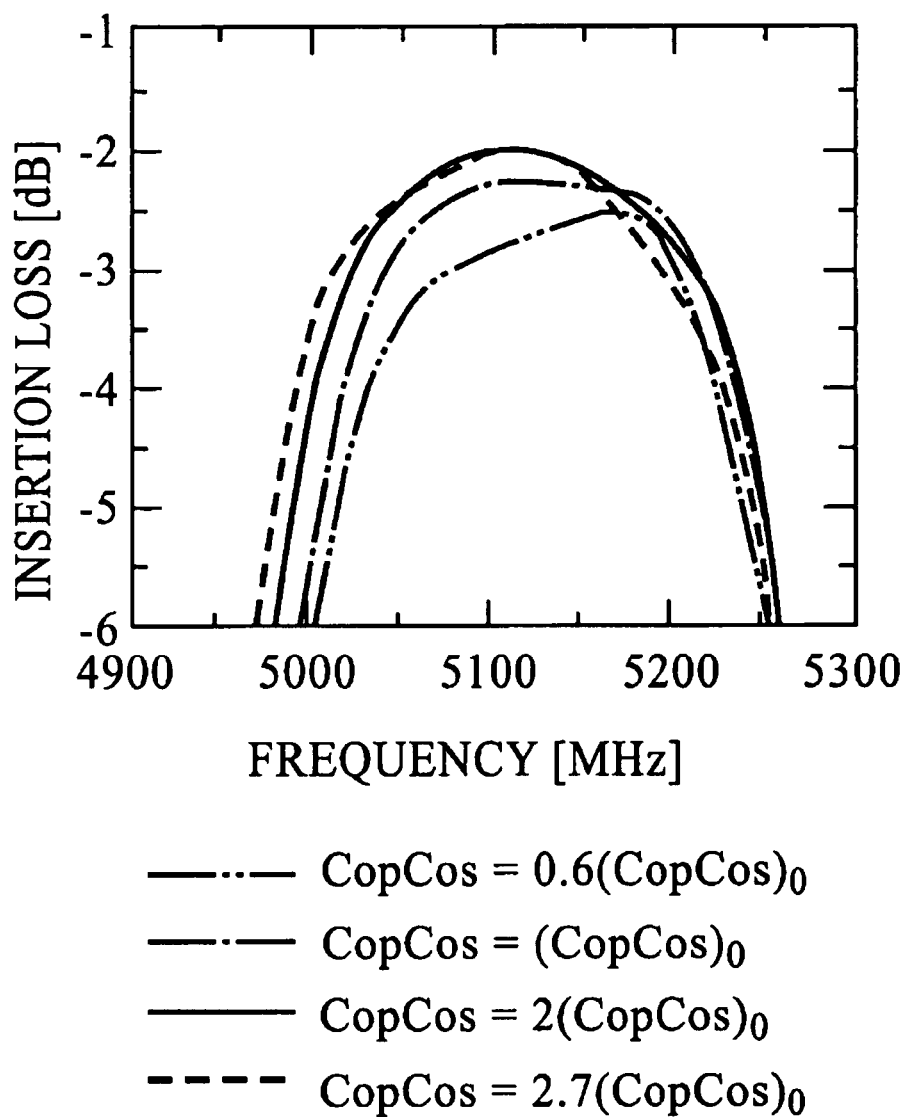
FIG. 9 is a graph showing filter characteristics comparisons among the samples used in the simulations of FIGS. 8A through 8D.

FIGS. 8A through 8D show the results of simulations carried out on the filter device 30, with the stray capacitance of the package 20, the inductance of the bonding wire 21, and the stray capacitance of the chip of the ladder-type SAW filter 10 being taken into consideration. In each of FIGS. 8A through 8D, the graph on the left shows the filter characteristics of a sample (a filter device), while the chart on the right shows a Smith chart of the sample. More specifically, FIG. 8A shows the results of a simulation carried out on a sample of the filter device 30 in which the product CopCos of the electrostatic capacitances of the parallel-arm resonators P and the series-arm resonators S is 0.6 times as large as the value $(CopCos)_0$ obtained in accordance with the expression (2) of the matching conditions. FIG. 8B shows the results of a simulation carried out on a sample of the filter device 30 in which the product CopCos is equal to the value $(CopCos)_0$ obtained in accordance with the expression (2). FIG. 8C shows the results of a simulation carried out on a sample of the filter device 30 in which the product CopCos is twice as large as the value $(CopCos)_0$ obtained in accordance with the expression (2). FIG. 8D shows the results of a simulation carried out on a sample of the filter device 30 in which the product CopCos is 2.7 times as large as the value $(CopCos)_0$ obtained in accordance with the expression (2). Further, FIG. 9 shows filter characteristics comparisons among the samples used in the simulations of FIGS. 8A through 8D.

As can be seen from FIGS. 8A through 8D, excellent impedance matching was achieved, where the ratio Cop/Cos of the electrostatic capacitance Cop of the parallel-arm resonators P to the electrostatic capacitance Cos of the series-arm resonators S was 0.5, and the product CopCos of the electrostatic capacitances Cop and Cos was twice as large as the value $(CopCos)_0$ obtained in accordance with the expression (2) of the matching conditions. As shown in FIG. 9, the sample that satisfies the same conditions as above exhibited the lowest insertion loss in the passband, and had the greatest bandwidth.

Figure 10:
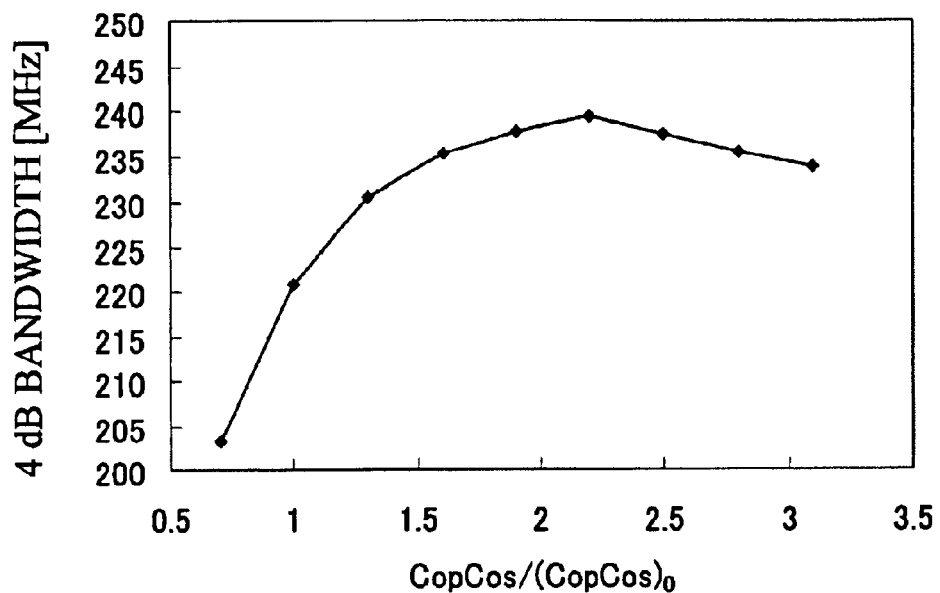
FIG. 10 is a graph showing the 4 dB bandwidths based on the filter characteristics of the first embodiment, with $CopCos/(CopCos)_0$ being varied from 0.7 to 3.1.

FIG. 10 is a graph that shows the results of experiments carried out to examine the above facts in greater detail. This graph shows the 4 dB bandwidth based on the filter characteristics obtained when the value $CopCos/(CopCos)_0$ was varied from 0.7 to 3.1. As can be seen from FIG. 10, the 4 dB bandwidth was greatest when the value $CopCos/(CopCos)_0$ was 2.2. This indicates that the best impedance matching can be achieved with a sample that satisfies the same conditions as above.

Also, to achieve excellent impedance matching, a sample should be designed so that the value $CopCos/(CopCos)_0$ falls in the range of 1 to 3.1, as can be seen from FIG. 10. This range of 1 to 3.1 is set to keep the 4 dB bandwidth within a 20 MHz range from the 4 dB bandwidth obtained when the value $CopCos/(CopCos)_0$ is 2.2. More preferably, a sample should be designed so that the value $CopCos/(CopCos)_0$ is in the range of 1.3 to 3.1. This is the range to keep the 4 dB bandwidth within a 10 MHz range from the 4 dB bandwidth obtained when the value $CopCos/(CopCos)_0$ is 2.2. Even more preferably, a sample should be designed so that the value $CopCos/(CopCos)_0$ is in the range of 1.6 to 2.9. This is the range to keep the 4 dB bandwidth within a 5 MHz range from the 4 dB bandwidth obtained when the value $CopCos/(CopCos)_0$ is 2.2.

Taking the above facts into consideration, the desirable conditions can be expressed as:

$$1(CopCos)_0 \leq CopCos \leq 3.1(CopCos)_0 \quad (4)$$

$$1.3(CopCos)_0 \leq CopCos \leq 3.1(CopCos)_0 \quad (5)$$

$$1.6(CopCos)_0 \leq CopCos \leq 2.9(CopCos)_0 \quad (6)$$

With $(CopCos)_0$ being $1/(\omega_0^2 R^2)$, the expressions (4) through (6) can be converted into the following expressions (7) through (9):

$$1 \times 10^6 \leq \omega_0^2 R^2 CopCos \leq 3.1 \times 10^6 (\omega_0 = 2\pi f_0) \quad (7)$$

$$1.3 \times 10^6 \leq \omega_0^2 R^2 CopCos \leq 3.1 \times 10^6 (\omega_0 = 2\pi f_0) \quad (8)$$

$$1.6 \times 10^6 \leq \omega_0^2 R^2 CopCos \leq 2.9 \times 10^6 (\omega_0 = 2\pi f_0) \quad (9)$$

where $f_0$ is the center frequency [GHz], and R is the nominal impedance [Ω].

Here, a resonator having an electrostatic capacitance C [pF] can be designed by determining the aperture length L [μm] and the number N of electrode finger pairs in accordance with the following expressions (10) and (11):

$$C = 2C_{00}lN, \; l = L/100 \quad (10)$$

$$C_{00} = 2 \times 10^{-2} [\text{pF}/100 \, \mu\text{m}] \quad (11)$$

More details concerning these expressions are disclosed in "Low-Loss Band Filter Using SAW Resonators (Yoshio Satoh, et al., IEICE Transactions, A, Vol. J76-A, No. 2, February 1993, pp. 245–252)".

As described so far, a filter device should be designed so that the product CopCos of the parallel-arm resonator capacitance Cop and the series-arm resonator capacitance Cos satisfies the conditions represented by the expression (7) or (8), or, more preferably, the expression (9). By doing so, an increase in chip size can be prevented, and improved impedance matching can be achieved. Further, adverse influence of stray capacitance of the ladder-type SAW filter can be reduced.

In the following, an experiment in which the filter device 30 having the above structure was produced will be described in detail, with reference to the accompanying drawings. In the experiment described below, the center frequency $f_0$ of the ladder-type SAW filter 10 was 5.25 GHz.

To produce the ladder-type SAW filter 10, a 42-degree Y-cut and X-propagation lithium tantalate crystal substrate was employed as the substrate 11. After forming a 73-nm thick aluminum film containing 1% copper on the substrate 11 by a sputtering technique, patterning was performed to form the IDTs 12, the reflection electrodes 13, the wiring unit 14, and the electrode pad unit 15, by a photolithography technique and a reactive ion etching (RIE) technique. The patterned substrate 11 was then diced to form the chip of the ladder-type SAW filter 10. The chip of the ladder-type SAW filter 10 was mounted on a ceramic package (made of aluminum nitrogen or alumina in this example) having an external size of 3 mm×3 mm, and was wire-bonded to the ceramic package with the bonding wire 21.

This ladder-type SAW filter 10 had a four-stage ladder structure in which parallel-arm resonators P having an electrostatic capacitance Cop and series-arm resonators S having an electrostatic capacitance Cos were connected in a ladder-like fashion. The product CopCos of the electrostatic capacitances of the series-arm resonators S and the parallel-arm resonators P was twice as large as the value $(CopCos)_0$ obtained in accordance with a logical expression of the matching conditions, and the electrostatic capacitance ratio Cop/Cos was 0.5. Accordingly, the aperture length and the number of electrode finger pairs in each of the series-arm resonators S and the parallel-arm resonators P were determined so that the electrostatic capacitance Cop became 0.61 pF, and the electrostatic capacitance Cos became 1.21 pF. More specifically, each parallel-arm resonator P had an electrode interval of 0.7343 μm, an aperture length of 20 μm, and 76 pairs of electrode fingers. Each series-arm resonator S had an electrode interval of 0.701 μm, an aperture length of 10 μm, and 303 pairs of electrode fingers. In the middle of the ladder structure, the two neighboring parallel-arm resonators P were combined into one, and the electrostatic capacitance of the combined resonators was twice as large as the electrostatic capacitance of a single parallel-arm resonator P. Accordingly, the combined parallel-arm resonators had an aperture length of 20 μm, and 152 pairs of electrode fingers.

Figure 11:
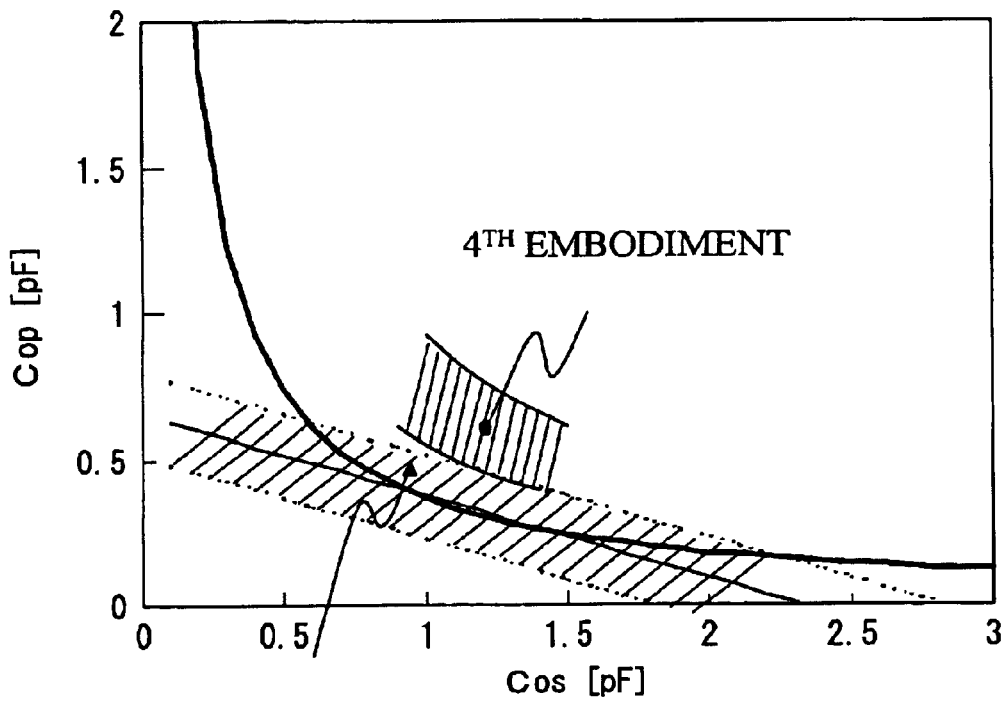
FIG. 11 is a graph showing the electrostatic capacitances Cops and Cos of the parallel-arm resonators and the series-arm resonators in a specific example of the ladder-type SAW filter of the first embodiment.

FIG. 11 shows the electrostatic capacitances Cop and Cos of the parallel-arm resonators P and the series-arm resonators S in the ladder-type SAW filter 10. As a comparative example, FIG. 11 also shows the electrostatic capacitances Cop and Cos of parallel-arm resonators P and series-arm resonators S that form a conventional ladder-type SAW filter. In this comparative example, the electrostatic capacitance product CopCos was 1.2 times as large as the value $(CopCos)_0$. Also in the comparative example, each parallel-arm resonator P had an electrode interval of 0.771 μm, an aperture length of 20 μm, and 59 pairs of electrode fingers, while each series-arm resonator S had an electrode interval of 0.7375 μm, an aperture length of 10 μm, and 235 pairs of electrode fingers.

As is apparent from FIG. 11, the electrostatic capacitance product CopCos of the ladder-type SAW filter 10 of this embodiment was greater than the electrostatic capacitance product CopCos of the comparative example. Accordingly, adverse influence of stray capacitance was smaller in the ladder-type SAW filter 10 of this embodiment.

Figure 12:
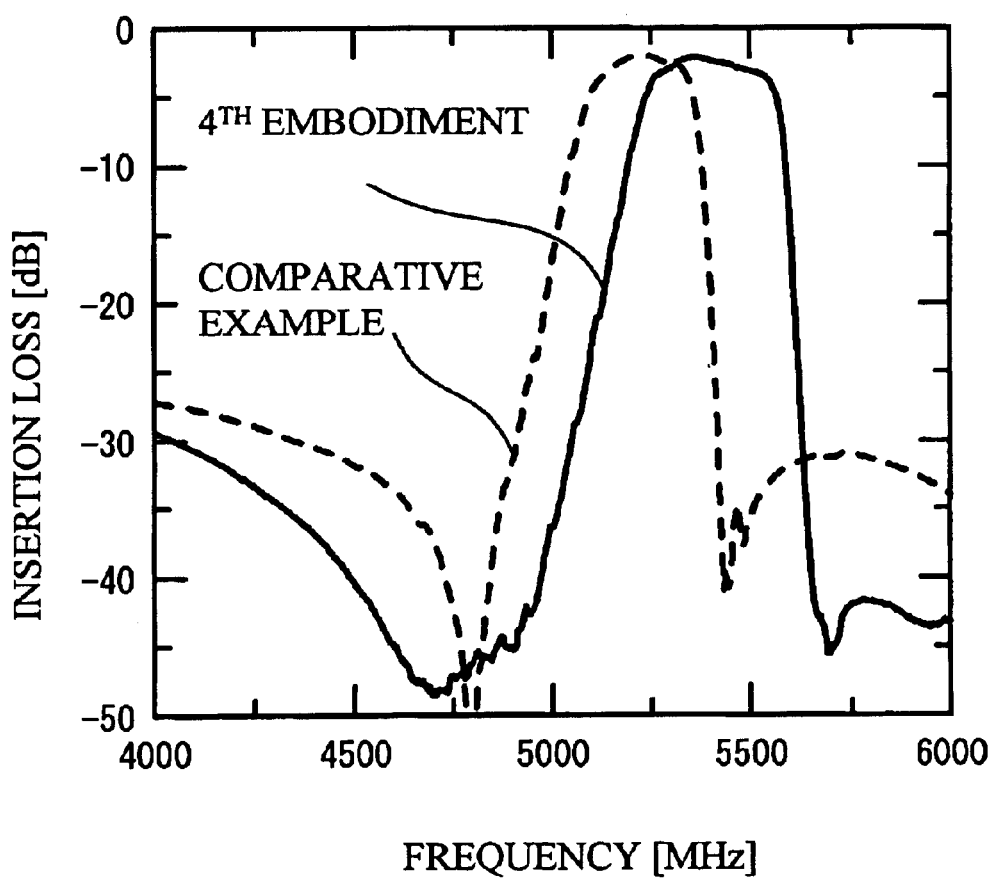
FIG. 12 is a graph showing the filter characteristics of a filter device having the specific example of the ladder-type SAW filter of the first embodiment mounted on a package.
Figure 13:
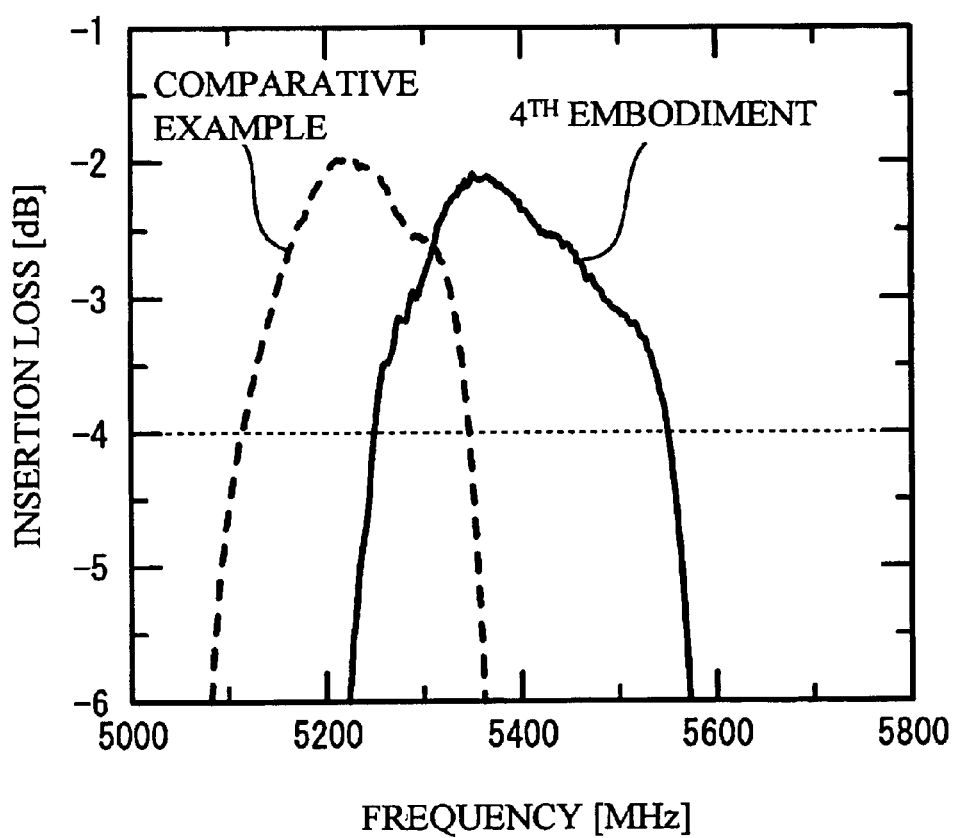
FIG. 13 is an enlarged view of the region from −1 dB to −6 dB of the filter characteristics shown in FIG. 12.
Figure 14:
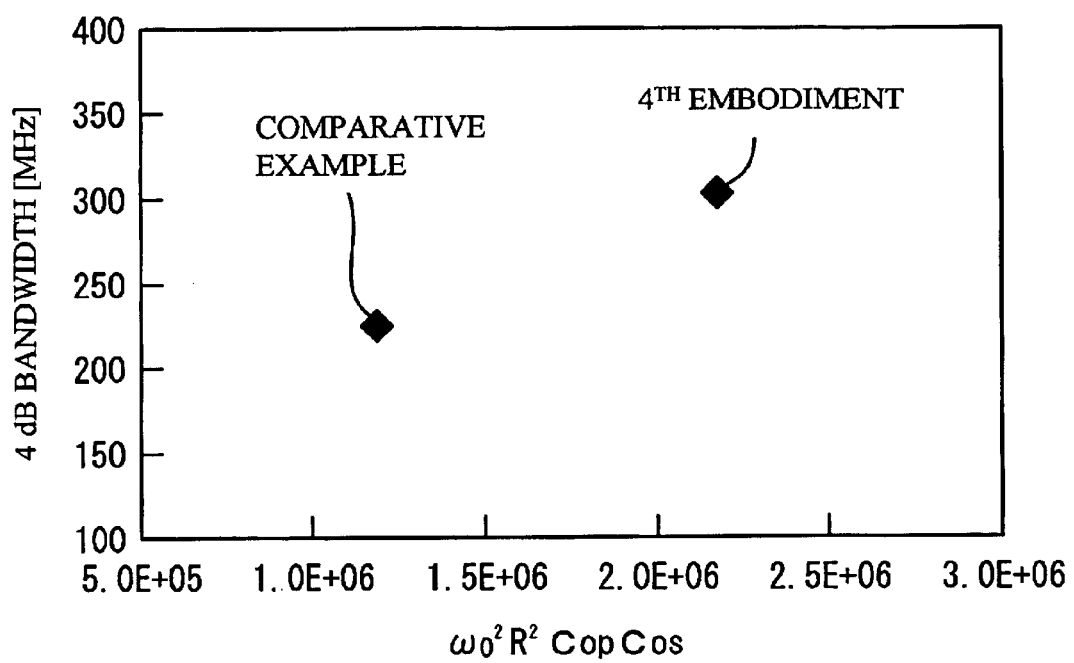
FIG. 14 is a graph showing the 4 dB bandwidths based on the graph shown in FIG. 13.

FIG. 12 shows the filter characteristics of the filter device 30 having the ladder-type SAW filter 10 of this embodiment mounted on the package 20. In FIG. 12, the filter characteristics of a filter device having the ladder-type SAW filter of the comparative example mounted on the package 20 are also shown by a broken line. As is apparent from FIG. 12, the filter characteristics of the filter device 30 of this embodiment exhibited a broader band area and greater stop-band suppression. FIG. 13 is an enlarged view of the region from −1 dB to −6 dB of the filter characteristics shown in FIG. 12. FIG. 14 shows the 4 dB bandwidths based on the characteristics shown in FIG. 13. As can be seen from FIG. 14, this embodiment exhibited a 4 dB bandwidth of 300 MHz, which was apparently broader than the 4 dB bandwidth of the comparative example, which was 230 MHz. It is obvious from the above fact that improved impedance matching was achieved with the ladder-type SAW filter 10 of this embodiment.

(Second Embodiment)

A second embodiment of the present invention will now be described in detail, with reference to the accompanying drawings. This embodiment has the same structure as the first embodiment, except that the length of the bonding wire 21 is optimized so that the inductance of the bonding wire 21 reduces the adverse influence of stray capacitance of the package 20. The ladder-type SAW filter 10 and the package 20 employed in this embodiment are the same as those in the first embodiment, and therefore, explanation of them will be omitted in the following description.

Figure 15A:
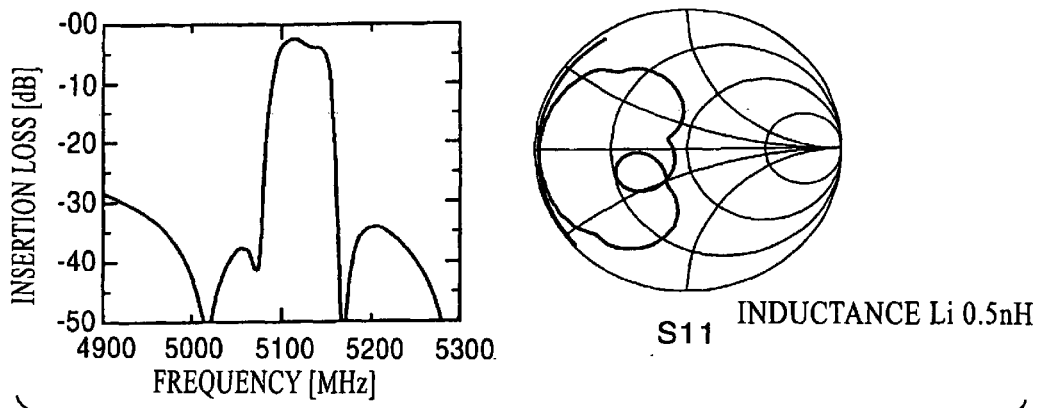
FIG. 15A is a graph and a chart showing the results of a simulation carried out on a sample having a bonding wire with an inductance of 0.5 nH in accordance with a second embodiment of the present invention.
Figure 15B:
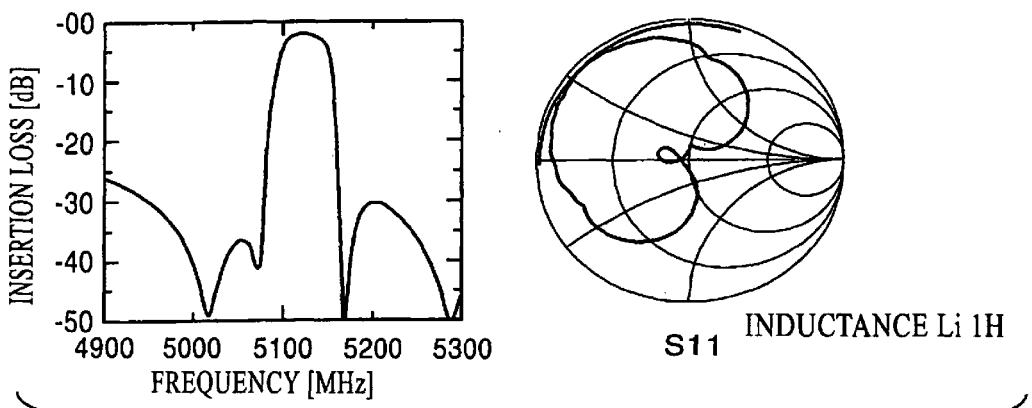
FIG. 15B is a graph and a chart showing the results of a simulation carried out on a sample having a bonding wire with an inductance of 1 nH.
Figure 15C:
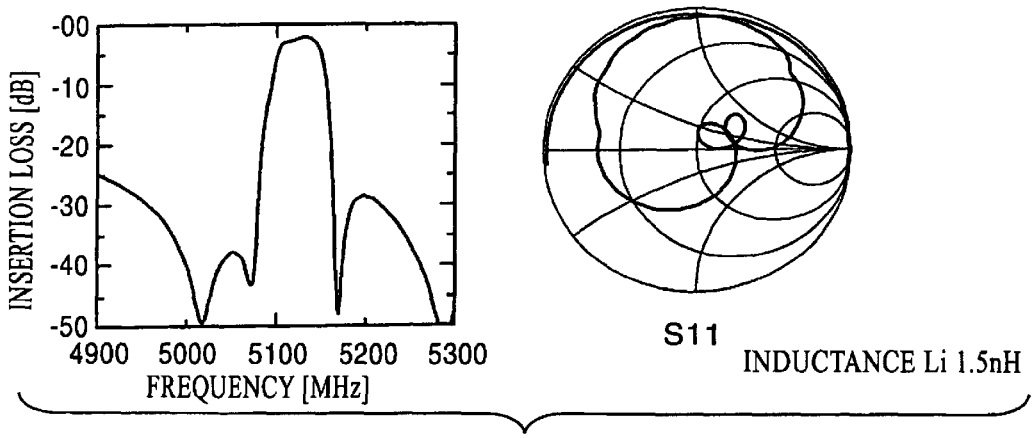
FIG. 15C is a graph and a chart showing the results of a simulation carried out on a sample having a bonding wire with an inductance of 1.5 nH.

FIGS. 15A through 15C show the results of simulations carried out on samples in which the inductance of the bonding wire 21 was varied from 0.5 nH to 1 nH to 1.5 nH. In each of FIGS. 15A through 15C, the graph on the left shows the filter characteristics of a sample (a filter device), and the chart on the right shows a Smith chart of the sample. FIG. 15A shows the results of a simulation carried out on a sample in which the bonding wire 21 had an inductance of 0.5 nH. FIG. 15B shows the results of a simulation carried out on a sample in which the bonding wire 21 had an inductance of 1 nH. FIG. 15C shows the results of a simulation carried out on a sample in which the bonding wire 21 had an inductance of 1.5 nH. Further, FIG. 16 shows filter characteristics comparisons among the samples used in the simulations of FIGS. 15A through 15C.

Figure 16:
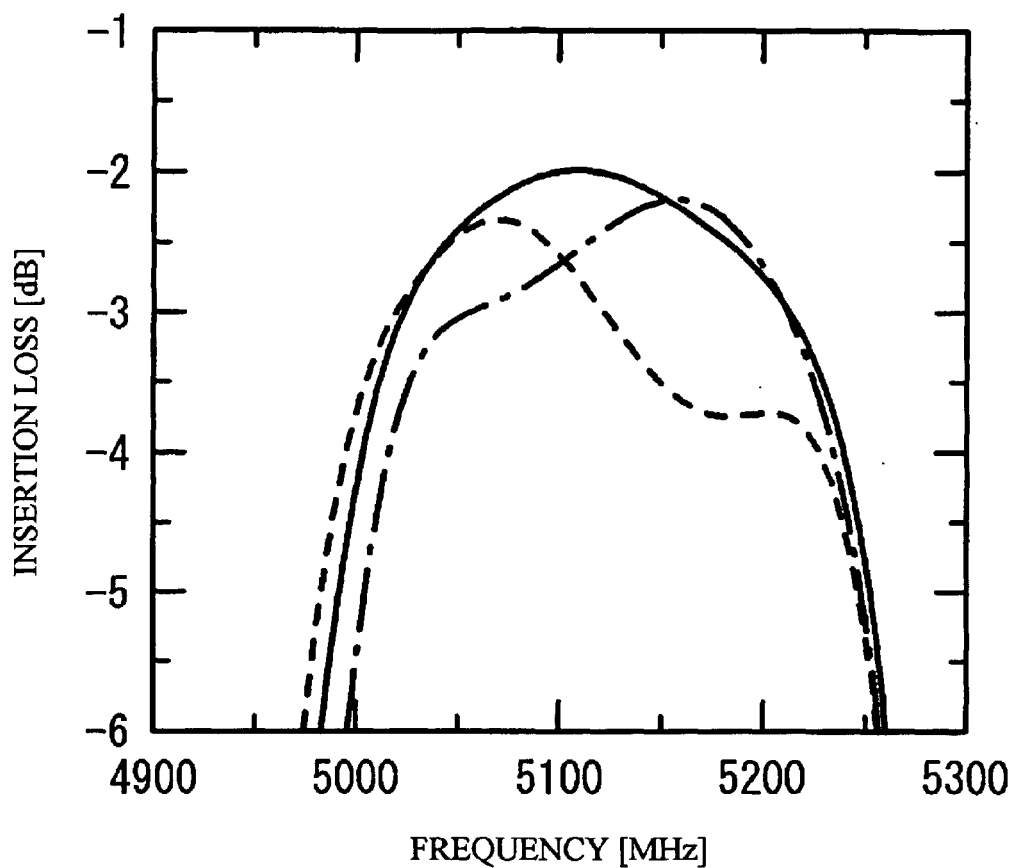
FIG. 16 is a graph showing the filter characteristics of the samples used in the simulations shown in FIGS. 15 through 15C.

As can be seen from FIGS. 15A through 15C, excellent impedance matching was achieved, where the inductance Li of the bonding wire 21 was 1 nH (see FIG. 15B and the solid line in FIG. 16). As shown in FIG. 16, the sample that satisfies the same conditions as above exhibited the lowest insertion loss in the passband, and had the greatest bandwidth.

In the following, an experiment in which the filter device 30 having the above structure was actually produced will be described in detail, with reference to the accompanying drawings. In the experiment described below, the center frequency $f_0$ of the ladder-type SAW filter 10 was also 5.25 GHz.

In this experiment, the filter characteristics and the VSWRs (Voltage Standing Wave Ratios) of samples were compared. Of these samples, one had the ladder-type SAW filter 10 connected to the package 20 with one bonding wire 21, one had the ladder-type SAW filter 10 connected to the package 20 with two bonding wires 21, and one had the ladder-type SAW filter 10 connected to the package 20 with three bonding wires 21.

The ladder-type SAW filter 10 employed in this experiment had the specific structure described in the First Embodiment, and the package 20 was an alumina (aluminum nitrogen) package having an external size of 3 mm×3 mm. Each of the bonding wires 21 was an aluminum wire of 1.2 mm in length and 30 μm in diameter.

Figure 17:
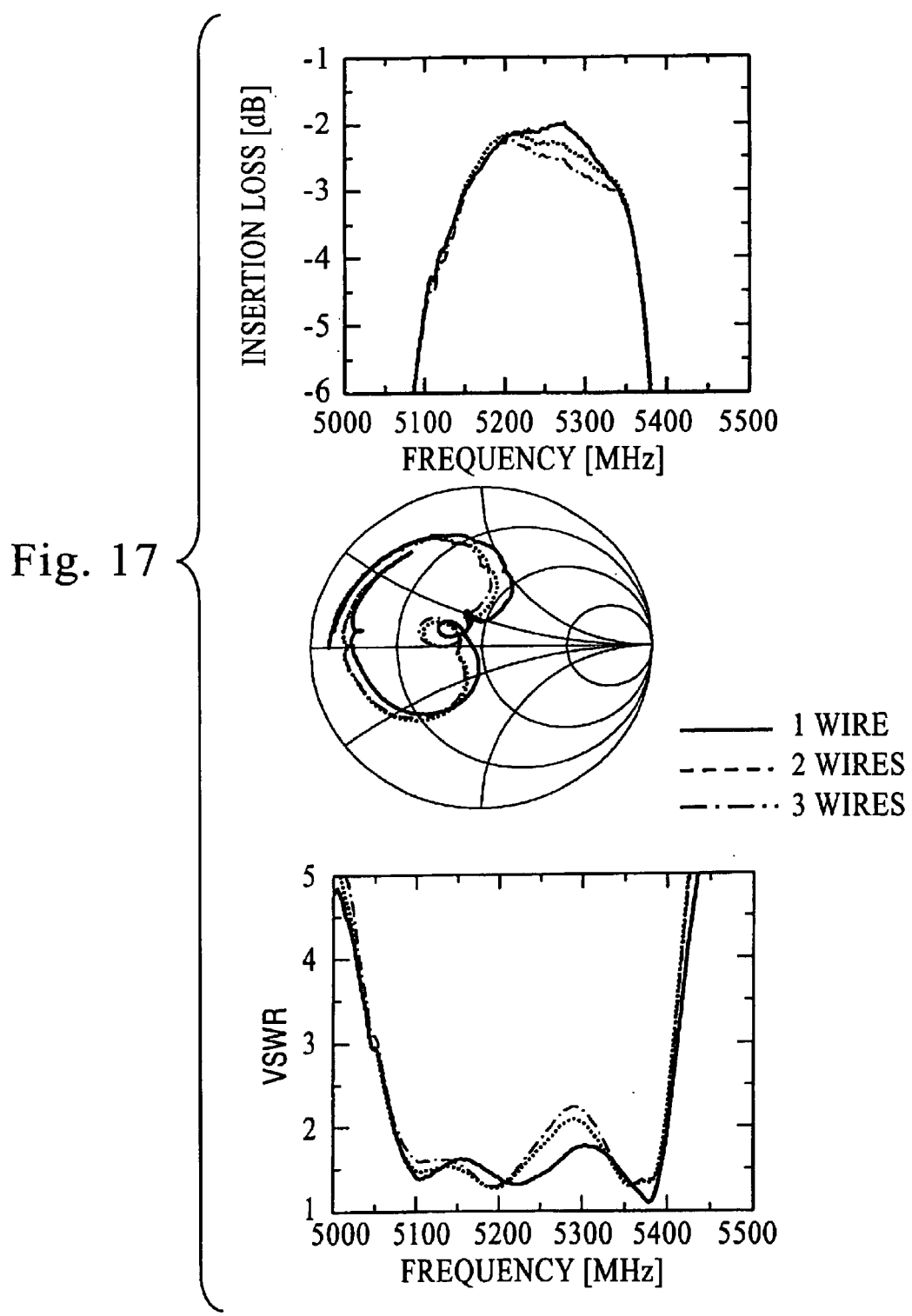
FIG. 17 is graphs and a chart showing the filter characteristics and the VSWRs of samples having specific structures in accordance with the second embodiment.

FIG. 17 shows the filter characteristics and the VSWRs of those samples. In FIG. 17, the graph at the top shows the filter characteristics of the samples (filter devices), the chart in the middle is a Smith chart, and the graph at the bottom shows the VSWRs. In these graphs and chart, the solid lines indicate the results of a simulation carried out on the sample having one bonding wire 21 with an inductance of 0.25 nH, the broken lines indicate the results of a simulation carried out on the sample having two bonding wires 21 with an inductance of 0.4 nH, and the dashed lines indicate the results of a simulation carried out on the sample having three bonding wires 21 with an inductance of 0.8 nH. Further, the VSWRs in relation to the inductances of these samples are shown in FIG. 18.

Figure 18:
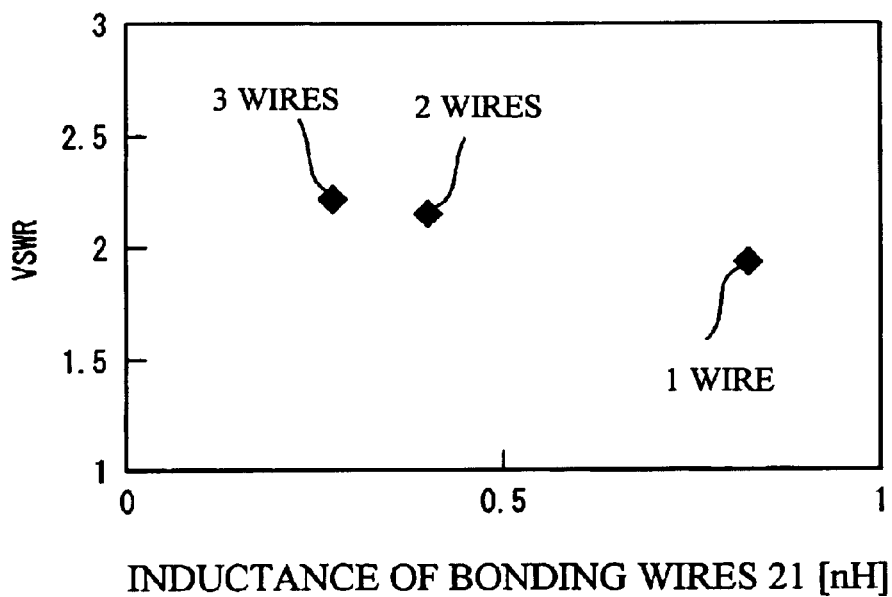
FIG. 18 is a graph showing the VSWRs in relation to the inductances of the bonding wire(s) of the samples having the filter characteristics shown in FIG. 17.

As can be seen from FIGS. 17 and 18, as the number of bonding wires 21 increased, the inductance became smaller, and the impedance matching deteriorated. As a result, the loss in the passband and the VSWR became greater. Judging from this fact, the number of bonding wires 21 should be 2 or smaller, and more preferably, one, to restrain the VSWR to 2 or smaller. With two or less bonding wires 21, the adverse influence of stray capacitance can be reduced.

Taking the above results into consideration, to achieve satisfactory impedance matching, the inductance Li of the binding wire 21 should be in the range shown by the following expression (12):

$$0.7 \leq Li \leq 1.3 \tag{12}$$

The upper limit of the inductance Li shown by the expression (12) indicates the largest possible effective value, and any inductance value exceeding this upper limit value is not very effective in achieving excellent impedance matching.

The material that is normally used for the bonding wire 21 has an inductance of approximately 0.85 nH per 1 mm. Accordingly, to keep the inductance within the range shown by the expression (12), the length Ln (mm) of the bonding wire 21 should be in the range shown by the following expression (13):

$$0.8 \leq Ln \leq 1.5 \tag{13}$$

With the bonding wire 21 having a length in the range shown by the expression (13), the impedance matching can be improved, and the adverse influence of stray capacitance of the ladder-type SAW filter can be reduced.
(Third Embodiment)

Although the ladder-type SAW filter 10 is housed in the package 20 in a face-up state, and is connected to the package 20 with the bonding wire 21 in the first embodiment, the present invention is not limited to that structure, and the ladder-type SAW filter 10 may also be face-down mounted on the package 20 by a flip-chip mounting technique. Such a structure will be described below as a third embodiment of the present invention, with reference to the accompanying drawings.

Figure 19:
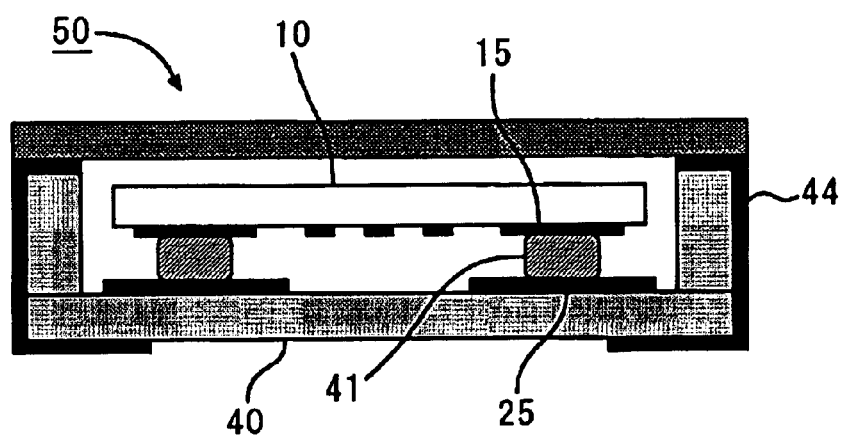
FIG. 19 is a section view of a filter device in accordance with a third embodiment of the present invention.

FIG. 19 is a section view of a filter device 50 in accordance with the third embodiment. In the filter device 50, the same ladder-type SAW filter 10 as that of the first embodiment (see FIG. 5) is employed.

As shown in FIG. 19, the ladder-type SAW filter 10 is housed in a package 40 in a face-down state. At this point, the electrode pad unit 15 of the ladder-type SAW filter 10 is connected to the electrode pad unit 25 of the package 40 with metal bumps 41 made of Au, Al, or solder.

In this structure, the electrostatic capacitance of each of the series-arm and parallel-arm resonators of the ladder-type SAW filter 10 is set to satisfy the conditions represented by the expression (2), so that the adverse influence of stray capacitance can be reduced, as in the first embodiment.

This embodiment can also be applied to the second embodiment having the ladder-type SAW filter 10 that is flip-chip mounted on the package 20. More specifically, microstrip lines that satisfy the condition represented by the expression 12 (or 13) is used for a wiring unit 44 formed on the package 40, so that the impedance matching is improved, and the adverse influence of stray capacitance of the ladder-type SAW filter 10 can be reduced. Such a structure using microstrip lines is shown in FIG. 20.

Figure 20:
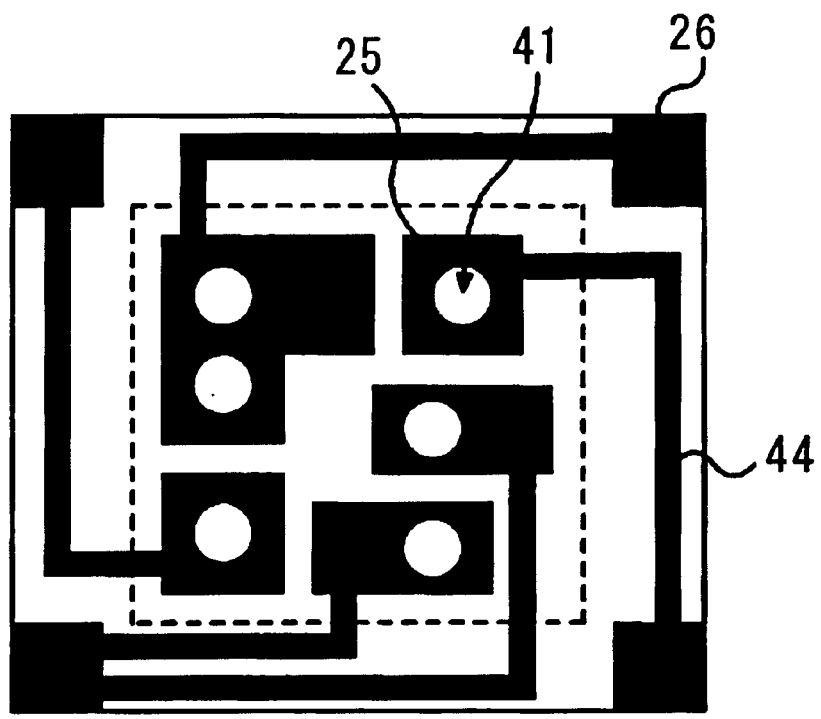
FIG. 20 illustrates a microstrip line structure in accordance with the third embodiment of the present invention.

As shown in FIG. 20, the package 40 of this embodiment includes the wiring unit 44 formed by microstrip lines, the electrode pad unit 25, and an external wiring pad unit 26. In this structure, the wiring unit 44 has a microstrip line structure as described above. The electrode pad unit 25 and the electrode pad unit 15 are connected to each other with the bumps 41.

With the above structure, increases in chip size can be prevented, the impedance matching can be improved, and the adverse influence of stray capacitance of the ladder-type SAW filter can be reduced.
(Fourth Embodiment)

Figure 21:
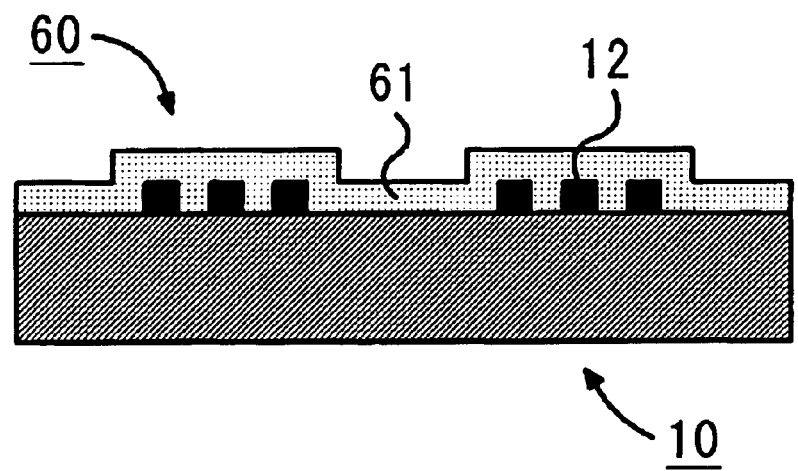
FIG. 21 is a section view of a filter device in accordance with a fourth embodiment of the present invention, taken along the line of the SAW propagation direction.

In the first to third embodiments described so far, at least the IDTs 12 of each ladder-type SAW filter 10, or more preferably, the entire conductive layer, may be covered with a dielectric film 61 such as a $SiO_2$ film, as shown in FIG. 21. With the dielectric film 61 covering the IDTs 12 or the entire conducive layer, it becomes possible to protect the IDTs 12 from corroding due to the cutting fluid used in the dicing process and the moisture in the air.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A surface acoustic wave filter comprising
series-arm resonators and parallel-arm resonators that are connected in a ladder-like fashion,
the surface acoustic wave filter satisfying conditions expressed as:

$$1 \times 10^6 \leq 4\pi^2 f_0^2 R^2 CopCos \leq 3.1 \times 10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance,
wherein the center frequency $f_0$ is in the 5 GHz band.
2. The surface acoustic wave filter as claimed in claim 1, wherein the ratio Cop/Cos of the electrostatic capacitance Cop to the electrostatic capacitance Cos is 0.5.
3. The surface acoustic wave filter as claimed in claim 1, wherein at least comb-like electrodes in the series-arm resonators and the parallel-arm resonators are covered with a dielectric film.

4. The surface acoustic wave filter as claimed in claim 1, wherein the series-arm resonators and the parallel-arm resonators are connected to form a four-stage structure.

5. A surface acoustic wave filter comprising series-arm resonators and parallel-arm resonators that are connected in a ladder-like fashion, the surface acoustic wave filter satisfying conditions expressed as:

$$1.3\times10^6 \leq 4\pi^2 f_0^2 R^2 CopCos \leq 3.1\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance, wherein the center frequency $f_0$ is in the 5 GHz band.

6. A surface acoustic wave filter comprising series-arm resonators and parallel-arm resonators that are connected in a ladder-like fashion, the surface acoustic wave filter satisfying conditions expressed as:

$$1.6\times10^6 \leq 4\pi^2 f_0^2 R^2 CopCos \leq 2.9\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance.

7. A filter device comprising:

a surface acoustic wave filter; and a package to which the surface acoustic wave filter is mounted by a wire bonding technique, the surface acoustic wave filter including series-arm resonators and parallel-arm resonators that are connected in a ladder-like fashion, the surface acoustic wave filter satisfying conditions expressed as:

$$1.6\times10^6 \leq 4\pi^2 f_0^2 R^2 CopCos \leq 2.9\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance, the package having a signal terminal connected to signal electrodes of the surface acoustic wave filter with one bonding wire, and the bonding wire having an inductance Li (nH) that satisfies conditions expressed as:

$$0.7 \leq Li \leq 1.3.$$

8. A filter device comprising:

a surface acoustic wave filter; and a package to which the surface acoustic wave filter is flip-chip mounted, the surface acoustic wave filter including series-arm resonators and parallel-arm resonators that are connected in a ladder-like fashion, the surface acoustic wave filter satisfying conditions expressed as:

$$1\times10^6 \leq 4\pi^2 f_0^2 R^2 CopCos \leq 3.1\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance, the package having a signal line formed by a microstrip line, and the microstrip line having an inductance Li (nH) that satisfies conditions expressed as:

$$0.7 \leq Li \leq 1.3.$$

9. A filter device comprising:

a surface acoustic wave filter; and a package to which the surface acoustic wave filter is flip-chip mounted, the surface acoustic wave filter including series-arm resonators and parallel-arm resonators that are connected in a ladder-like fashion, the surface acoustic wave filter satisfying conditions expressed as:

$$1.3\times10^6 \leq 4\pi^2 f_0^2 R^2 CopCos \leq 3.1\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance, the package having a signal line formed by a microstrip line, and the microstrip line having an inductance Li (nH) that satisfies conditions expressed as:

$$0.7 \leq Li \leq 1.3.$$

10. A filter device comprising:

a surface acoustic wave filter; and a package to which the surface acoustic wave filter is flip-chip mounted, the surface acoustic wave filter including series-arm resonators and parallel-arm resonators that are connected in a ladder-like fashion, the surface acoustic wave filter satisfying conditions expressed as:

$$1.6\times10^6 \leq 4\pi^2 f_0^2 R^2 CopCos \leq 2.9\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance, the package having a signal line formed by a microstrip line, and the microstrip line having an inductance Li (nH) that satisfies the conditions expressed as:

$$0.7 \leq Li \leq 1.3.$$

11. A filter device comprising:

a surface acoustic wave filter; and a package to which the surface acoustic wave filter is mounted by a wire bonding technique, the surface acoustic wave filter including series-arm resonators and parallel-arm resonators that are connected in a ladder-like fashion, the surface acoustic wave filter satisfying conditions expressed as:

$$1\times10^6 \leq 4\pi^2 f_0^2 R^2 CopCos \leq 3.1\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance, the package having a signal terminal connected to signal electrodes of the surface acoustic wave filter with one bonding wire, and the bonding wire having an inductance Li (nH) that satisfies conditions expressed as:

$$0.7 \leq Li \leq 1.3$$

wherein the ratio Cop/Cos of the electrostatic capacitance Cop to the electrostatic capacitance Cos is 0.5.

12. The filter device as claimed in claim 11, wherein at least comb-like electrodes in the series-arm resonators and the parallel-arm resonators are covered with a dielectric film.

13. The filter device as claimed in claim 11, wherein the series-arm resonators and the parallel-arm resonators are connected to form a four-stage structure.

14. The filter device as claimed in claim 11, wherein the package is made of ceramics.

15. A filter device comprising:

a surface acoustic wave filter; and a package to which the surface acoustic wave filter is mounted by a wire bonding technique, the surface acoustic wave filter including series-arm resonators and parallel-arm resonators that are connected in a ladder-like fashion, the surface acoustic wave filter satisfying conditions expressed as:

$$1\times10^6 \leq 4\pi^2 f_0^2 R^2 CopCos \leq 3.1\times10^6$$

where Cop (pF) is an electrostatic capacitance of the parallel-arm resonators, Cos (pF) is an electrostatic capacitance of the series-arm resonators, $f_0$ (GHz) is a center frequency, and R is a nominal impedance, the package having a signal terminal connected to signal electrodes of the surface acoustic wave filter with one bonding wire, and the bonding wire having an inductance Li (nH) that satisfies conditions expressed as:

$$0.7 \leq Li \leq 1.3$$

wherein the center frequency $f_0$ is in the 5 GHz band.

* * * * *